(12) United States Patent
Fuji

(10) Patent No.: US 7,646,633 B2
(45) Date of Patent: Jan. 12, 2010

(54) METHOD FOR PROGRAMMING PHASE-CHANGE MEMORY AND METHOD FOR READING DATE FROM THE SAME

(75) Inventor: Yukio Fuji, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/038,547

(22) Filed: Feb. 27, 2008

(65) Prior Publication Data

US 2008/0212363 A1    Sep. 4, 2008

(30) Foreign Application Priority Data

Mar. 2, 2007    (JP) .............................. 2007-052787

(51) Int. Cl.
    *G11C 11/00*    (2006.01)
(52) U.S. Cl. ...................................... 365/163; 365/100
(58) Field of Classification Search ................. 365/163, 365/100, 148
    See application file for complete search history.

(56) References Cited

U.S. PATENT DOCUMENTS 7,149,103 B2 *   12/2006   Ahn ........................... 365/148
7,414,883 B2 *   8/2008    Gordon et al. ............... 365/163
7,570,524 B2 *   8/2009    Bedeschi et al. ........ 365/189.06

2008/0112218 A1 *   5/2008   Katagiri ...................... 365/163

FOREIGN PATENT DOCUMENTS

EP    1 202 285 A2    5/2002
JP    2002-203392 A   7/2002

OTHER PUBLICATIONS

Chen et al., "A New Thin-film, Cross-point Non-volatile Memory Using Threshold Switching Properties of Phase-change Chalcogenide", IEEE, 2004, pp. 685-690.
Kang et al., "A 0.1 μm 1.8V 256Mb 66MHz Synchronous Burst PRAM", ISSCC Dig. Tech. Papers, Feb. 2006, pp. 140-141 & 644, IEEE.

* cited by examiner

*Primary Examiner*—Anh Phung
(74) *Attorney, Agent, or Firm*—Sughrue Mion, PLLC

(57) ABSTRACT

When a phase-change element that can transition between a reset state (amorphous state) and a set state (crystalline state) is to be caused to transition to the reset state, a first pulse having a first voltage is applied to the phase-change element. The first voltage is higher than the threshold voltage in the reset state, and can cause current to flow that corresponds to an amount of generated heat required for placing the element in the reset state. When the phase-change element is to be caused to transition to the set state, a second pulse having a second voltage and the same time width as the first pulse is applied to the phase-change element. The second voltage that is higher than the threshold voltage but lower than the first voltage, and can cause only a current to flow that does not attain the necessary amount of generated heat.

4 Claims, 5 Drawing Sheets

Applied pulses

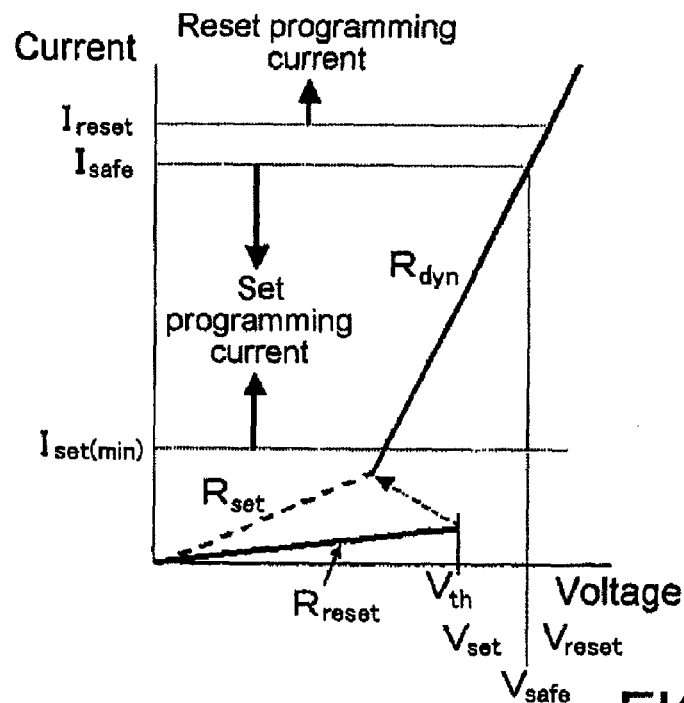
FIG. 3
PRIOR ART
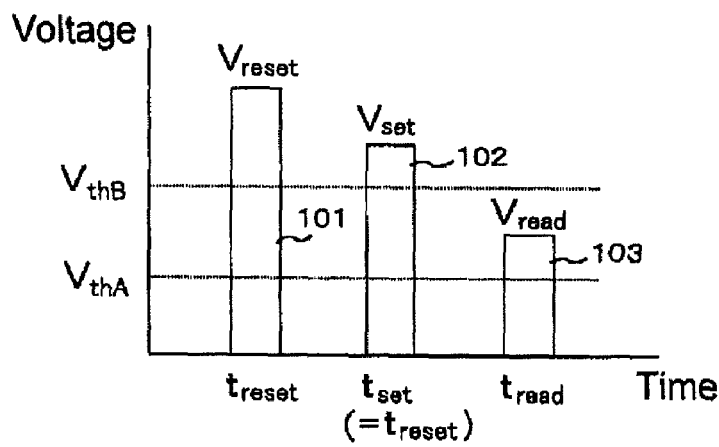
Applied pulses   FIG. 4

METHOD FOR PROGRAMMING PHASE-CHANGE MEMORY AND METHOD FOR READING DATE FROM THE SAME

This application is based upon and claims the benefit of priority from Japanese patent application No. 2007-052787, filed on Mar. 2, 2007, the disclosure of which is incorporated herein in its entirety by reference.

BACKGROUND OF THE INVENTION

1. Field of the Invention

The present invention relates to a programming method for recording data in a phase-change memory, and to a reading method for reading data stored in a phase-change memory.

2. Description of the Related Art

Similar to a memory device used in desktop equipment, high performance and high functionality are increasingly demanded of a memory device used for mobile applications, i.e., used for such purposes as portable apparatuses such as portable telephones and various other handheld information devices. A Memory device used for mobile applications must of course have high capacity on the level of, for example, a general-purpose DRAM (Dynamic Random Access Memory), must have a data bit width as large as, for example, 32 bits, must employ access technology such as DDR (Double Data Rate) to enable high-speed access, and moreover, due to its use in mobile devices, must also feature low power consumption. From the standpoint of maintaining long battery life in a portable device in which such a memory device is installed, there is a particularly strong requirement that the memory device continues to hold data despite cut-off of the power supply, i.e., that the memory device is non-volatile. Further, from the standpoint of improving system performance, it is particularly desirable to enable a high-capacity and non-volatile RAM (Random Access Memory) device that is capable of high-speed operation.

As high-speed programmable/readable storage devices, advances have been made in recent years in the development of, for example, MRAM (Magnetic RAM) that uses magnetoresistance effect elements, FeRAM (Ferroelectric RAM) that uses ferroelectric elements, and further, phase-change RAM (PRAM) such as a phase-change memory device that uses phase changes in a substance to store information. Of these, the phase-change memory has received particular attention due to the simplicity of its fabrication, the ease of its application to semiconductor processes, and further, its adaptability to microprocessing and memory element scaling. A method of decreasing the synchronous write bit-width and lowering current consumption of a phase-change memory device has been proposed as a method of reducing programming current in product specifications in Sangbeom Kang et al., "A 0.1 μm 1.8V 256 Mb 66 MHz Synchronous Burst PRAM," ISSCC Dig. Tech. Papers, pp. 140-141, 644, February, 2006.

A phase-change memory device takes advantage of the properties of chalcogenide materials such as germanium, antimony, and tellurium (Ge, Sb and Te) that, by the application of heat, transition between an amorphous state exhibiting high electrical resistance and a crystalline state exhibiting low electrical resistance. This type of a phase-change memory device is made up from: a memory element having a phase-change element composed of, for example, a chalcogenide; and a selector transistor for selecting one bit. Chalcogenide materials are known to change phase between a crystalline state that is low resistance and an amorphous state that is high resistance due to differences of heat generating processes. This phenomenon was discovered by Stanford Ovshinsky, and chalcogenide materials are now receiving great attention as memory material with the potential for use as a universal memory with names such as OUM (Ovonyx Unified Memory).

Generally, in a phase-change memory, changes between a high-resistance state and low-resistance state in each phase-change element are caused by the joule heat produced by the flow of electric current in the memory element and the time interval of application of the current, and a large current must therefore flow in the memory elements. The high-resistance state, i.e., the amorphous state, is referred to as the "reset state," and the low-resistance state, i.e., the crystalline state, is referred to as the "set state." For example, in academic conferences such as the VLSI Symposium and ISSCC (IEEE International Solid-State Circuits Conference), examples have been reported in which the programming current of a phase-change memory, and in particular, the current in the reset programming process for changing the crystalline state to the amorphous state was on the order of 400 μA to 600 μA.

FIG. 1A shows a sectional view of an example of the configuration of a memory cell of a representative phase-change memory device, and FIG. 1B shows an equivalent circuit of the memory cell shown in FIG. 1A.

Memory elements for each bit are formed between semiconductor substrate 800 and upper electrode 801 arranged over semiconductor substrate 800. Each of the memory elements is of a configuration in which phase-change element 803 composed of a phase-change material and heater 805 for heating this phase-change element 803 are connected in a series in a column or post which is perpendicularly formed on a surface of substrate 800. In this case, the phase-change element is composed of a ternary material of Ge—Sb—Tb and is abbreviated as "GST." Contact material 802 is provided between upper electrode 801 and the upper surface of phase-change element 803 in the figure for electrically connecting the two components. The bottom surface of phase-change element 803 is directly connected to the upper surface of cylindrical heater 805, and the lower surface of heater 805 contacts semiconductor substrate 800. The portion of the surface of semiconductor substrate 800 that contacts heater 805 and the area surrounding this portion are diffusion layer 809D. This diffusion layer functions as the lower electrode for the memory element. In addition, another diffusion layer 809S is formed on the surface of semiconductor substrate 800 separated from the formation position of heater 805, and source electrode 807 is electrically connected to this diffusion layer 809S by way of contact 808. Gate electrode 806 is formed to straddle these two diffusion layers 809D and 809S, and memory cell transistor Tr for selecting this memory cell is formed by gate electrode 806 and diffusion layers 809D and 809S.

In this configuration, upper electrode 801 is typically bit line BL in the memory device as shown in FIG. 1B and serves as the supply source of the voltage and current to the memory cell both when programming and reading this memory element is performed by using a bit line. Phase-change element (GST) 803 and heater 805 are electrically connected in a series between bit line BL (i.e., upper electrode 801) and the drain of memory cell transistor Tr. In the equivalent circuit diagram of FIG. 1B, heater 805 is not clearly shown. The source of memory cell transistor Tr is grounded by way of source electrode 807, i.e., the source is connected to ground potential GND. Gate voltage $V_G$ is applied to gate electrode 806 of transistor Tr. The voltage across the source and drain of the transistor Tr is denoted by $V_{ds}$.

When one bit of data is written to phase-change element 803, i.e., when carrying out programming, voltage is applied across upper electrode 801 and diffusion layer (i.e., lower electrode) 809D to generate heat represented by heat generation amount $I^2R$ per unit time based on the value I of electric current that flows in this interval and the resistance R of heater 805. As a result, the heat is conveyed from the interface between heater 805 and phase-change element 803 toward phase-change element 803. At this time, phase-change element 803 can be programmed to either of the amorphous state and crystalline state by changing current I flowing in memory element 803 and the ON time intervals.

FIG. 2 shows a typical current waveform that has been in use for programming of a phase-change memory in the related art. In FIG. 2, the horizontal axis shows the programming time and the vertical axis shows the temperature profile that is made up from the current and resistance. A typical programming method shown in FIG. 2 is explained based on this current waveform.

First, it is assumed that GST (i.e., phase-change element 203), which is the memory material, is in a crystalline state. A temperature surpassing the melting temperature (melting point) $T_m$ of GST is applied to the GST for a short time interval, following which the GST is rapidly cooled for a short time interval. This operation is referred to as "resetting" and is a heat profile for changing the phase of the GST from the crystalline state to the amorphous state. When causing the GST to transition from the amorphous state to the crystalline state, a heat pulse that is longer than at the time of resetting is applied to the GST at temperature $T_x$ that is lower than $T_m$, followed by slow cooling. This operation is referred to as "setting." The heat applied to the GST is given by the product of the square of current I flowing through the GST itself or through the resistance element such as the heater material and the resistance R.

When programming is carried out in this way, a hemispherical phase-change portion is produced in phase-change element 803 under the influence of the heat from heater material 805 as shown by reference numeral 804 in FIG. 1A.

FIG. 3 is a graph showing conditions for programming a phase-change element and the definitions and margins for the writing and reading currents. FIG. 3 shows the device characteristics of the phase-change element (GST) when in the amorphous state (i.e., reset state). When voltage $V_{GST}$ applied to the phase-change element is gradually increased while monitoring current that flows to resistance $R_{reset}$ of the phase-change element when in the reset state, a phenomenon occurs upon reaching a particular fixed voltage $V_{th}$ in which the slope of the voltage-current curve exhibits a great change and a current that accords with dynamic resistance $R_{dyn}$ suddenly flows. This phenomenon is called OTS (Ovonic Threshold Switching), voltage $V_{th}$ being the threshold voltage for bringing about the OTS phenomenon. After the occurrence of OTS, the application of a current of at least $I_{reset}$ can cause the phase-change element to change to the reset state, or the application of a current of at least $I_{set(min)}$ but no greater than $I_{safe}$ can cause the phase-change element to change to the set state. $I_{reset}$ and $I_{safe}$ are the upper and lower limits of the margin portion between the reset programming current and set programming current respectively. If the voltage across the two ends of a phase-change element is $V_{GST}$, $V_{GST}$ where current $I_{safe}$ is obtained is defined as $V_{safe}$. The voltage at the time of set programming is indicated by $V_{set}$. In addition, in FIG. 3, the voltage-current curve for a phase-change element (of resistance $R_{set}$) when in the set state is shown by a broken line.

In addition, programming from the crystalline state (set state) to the amorphous state (reset state) can also be carried out by applying a voltage greater than $V_{safe}$ to supply the phase-change element with a current of at least $I_{reset}$ and thus generate a phase-change to the reset state. Voltage at the time of reset programming is shown by $V_{reset}$.

Realizing phase-change memory as a commercial product both calls for miniaturization of the device and requires the realization of low-current consumption as performance demanded in recent years for mobile uses. To realize low current consumption, the reduction of the above-described programming current is considered essential. The reset programming current for each bit is currently on the order of 100 µA to 200 µA, and a large-scale reduction of this amount is sought. To achieve a reduction of the programming current, a search is ongoing for materials having compositions suitable for the phase-change element (GST) and investigations are also being conducted to improve the programming method.

Generally, the programming current (or the voltage applied to the phase-change element) and the applied pulse-width are different when causing a transition to the reset state (i.e., high-resistance state) and when causing transition to the set state (i.e., low-resistance state) in the programming of a phase-change memory. Typically, the reset pulse width is on the order of 100 ns, and the set pulse width is on the order of 500 ns. In a high-speed phase-change memory, the reset pulse width is expected to be 10 ns or less, and the set pulse width is expected to be on the order of 30 ns.

Despite reduction of the reset programming current with advances in the development of a phase-change memory, currently, in the programming of a phase-change memory, programming pulses having two different widths for setting and resetting must be used, and a current supply required for each of these pulses must be implemented. In other words, circuits are required both for generating and controlling each pulse and for controlling and supplying each current.

When realizing a non-volatile RAM, however, the operating speed must be on the same order as that of a typical universal DRAM. If a synchronous DRAM is considered as the universal DRAM, the programming speed demanded for an operating speed of 100 MHz is 10 ns or less for each address. Thus, even if it is supposed that a resetting speed of 10 ns or less and a setting speed of 30 ns or less could be realized in a phase-change memory, set programming cannot be effected in pulse signals of one shot, and the above-described operating speed cannot be achieved. To suppress the programming time interval, a configuration is possible in which limits are placed on programming and reading. For example, programming may be carried out only in continuous determined page units, but adopting such a configuration not only prevents the high-speed and random access as in an ordinary RAM, but also leads to an increase in the scale of the control circuits in the memory array portion in a memory device. Increase in the scale of the control circuits in the memory array portion has a significant effect on chip size in a semiconductor memory device having a phase-change memory, and has a particularly important influence on reading speed, thereby affecting high-speed reading.

Japanese Patent Laid-Open publication No. 2002-203392 (JP-A-2002-203392), which corresponds to EP-A-1 202 285, discloses a phase-change memory that, by stacking a plurality of phase-change material layers having different crystallization characteristics, is capable of storing multiple values per cell, i.e., can store the information of a plurality of bits. In addition, an example of a phase-change memory is also described in Yi-Chou Chen et al., "A new thin-film cross-point non-volatile memory using threshold switching properties of phase-change chalcogenide," 2004/IEEE, pp. 685-690.

As described hereinabove, a phase-change memory is sought that not only reduces power consumption but also shortens the time interval for set programming. However, such a phase-change memory suffers from the drawbacks that, in programming the phase-change memory, the generation of pulses of different time widths during set programming and during reset programming hinders the high-speed operation of the phase-change memory, and further, complicates the circuits for generating these pulses. In addition, an increase in the speed of reading information from the phase-change memory while maintaining low power consumption is also sought.

SUMMARY OF THE INVENTION

It is an object of the present invention to provide a novel programming method for enabling high-speed operation of the phase-change memory.

It is another object of the present invention to provide a novel reading method that enables high-speed operation of a phase-change memory.

According to the first exemplary aspect of the present invention, a programming method of a phase-change memory having a phase-change element that transitions between a reset state corresponding to an amorphous state and a set state corresponding to a crystalline state includes: when the phase-change element is to be caused to transition to the reset state, applying to the phase-change element a first pulse having a first voltage that is a voltage higher than a threshold voltage for causing threshold switching in the phase-change element in the reset state, and moreover, that is a voltage that can cause a current to flow that corresponds to an amount of generated heat necessary for placing the phase-change element in the reset state; and when the phase-change element is to be caused to transition to the set state, applying to the phase-change element a second pulse having a second voltage that is higher than the threshold voltage but lower than the first voltage, and moreover, that is a voltage that only causes current to flow that cannot attain the necessary amount of generated heat, wherein the time width of the first pulse is equal to the time width of the second pulse.

According to the second exemplary aspect of the present invention, a programming method of a phase-change memory having a phase-change element that transitions between a reset state corresponding to an amorphous state and a set state corresponding to a crystalline state includes: when the phase-change element is to be caused to transition to the reset state, applying to the phase-change element a first pulse of a first current such that the phase-change element is placed in a state in which threshold switching is brought about at a first threshold voltage after application of the first pulse; and when the phase-change element is to be caused to transition to the set state, applying to the phase-change element a second pulse of a second current such that the phase-change element is placed in a state in which threshold switching is brought about at a second threshold voltage that is lower than the first threshold voltage after the application of the second pulse, wherein the second current is smaller than the first current, and the time width of the first pulse is equal to the time width of the second pulse.

In this programming method, the first threshold voltage corresponds to, for example, a threshold voltage causing the phase-change element in the reset state to start threshold switching, and the second threshold voltage corresponds to, for example, a threshold voltage causing the phase-change element in the set state to start threshold switching.

According to a third exemplary aspect of the present invention, a method of reading information from a phase-change memory having a phase-change element that transitions between a reset state corresponding to an amorphous state and a set state corresponding to a crystalline state includes: taking, as a first threshold voltage, a threshold voltage for causing the phase-change element when in the reset state to start threshold switching, and, as a second threshold voltage, a threshold voltage for causing the phase-change element when in the set state to start threshold switching; and applying to the phase-change element a read voltage that is a voltage between the first threshold voltage and the second threshold voltage and detecting whether current has flowed due to threshold switching in the phase-change element or not to read information that has been programmed in the phase-change element.

According to the fourth exemplary aspect of the present invention, a method of reading information from a phase-change memory that has been programmed by a method according to the above-described second exemplary aspect includes: applying to the phase-change element a read voltage that is a voltage between the first threshold voltage and the second threshold voltage and detecting whether current has flowed due to threshold switching in the phase-change element or not to read information that has been programmed in the phase-change element.

According to the above-described configuration, adopting a programming method based on the threshold voltage $V_{th}$ in place of the so-called resistance-change programming method enables control of the state of the phase-change element even when an accurate resistance difference cannot be set in the phase-change element. As a result, there is no need to change the time width in the set pulses and reset pulses. According to the present invention, the need for superfluous pulse generation circuits or control circuits is eliminated and circuit scale in the memory device can be reduced.

In addition, the reading method based on the present invention uses a method for reading the voltage drop of the read voltage realized by threshold switching, whereby reading can be realized at a higher speed than a reading method that carries out current detection and voltage conversion by means of a resistance-change programming method.

The above and other objects, features, and advantages of the present invention will become apparent from the following description based on the accompanying drawings which illustrate examples of preferred embodiments of the present invention.

BRIEF DESCRIPTION OF THE DRAWINGS

FIG. 3 is a graph showing the current-voltage curve in a phase-change element, and shows the conditions for programming a phase-change element and the definition and margins for the writing and reading currents;

FIG. 4 is a waveform chart showing program pulses and a read pulse for a phase-change memory according to the first exemplary embodiment of the present invention;

DETAILED DESCRIPTION OF THE EXEMPLARY EMBODIMENTS

Figure 1A:
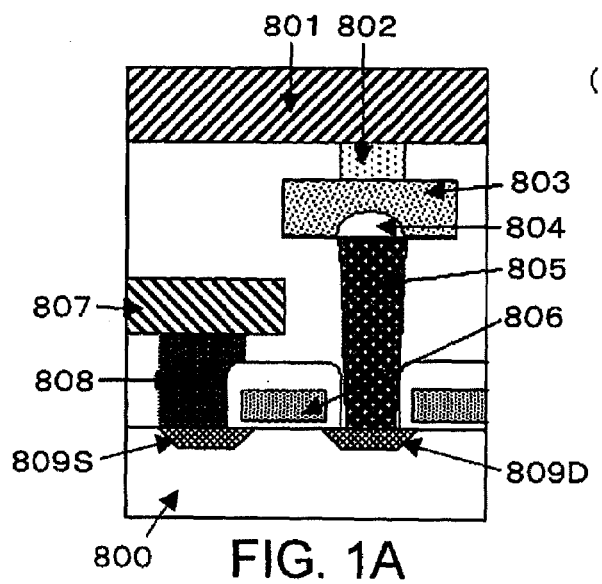
FIG. 1A is a sectional view showing a representative configuration of a memory cell of a phase-change memory.
Figure 1B:
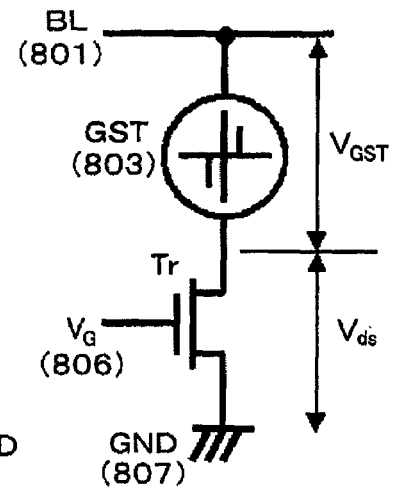
FIG. 1B is an equivalent circuit diagram of the memory cell shown in FIG. 1A.
Figure 2:
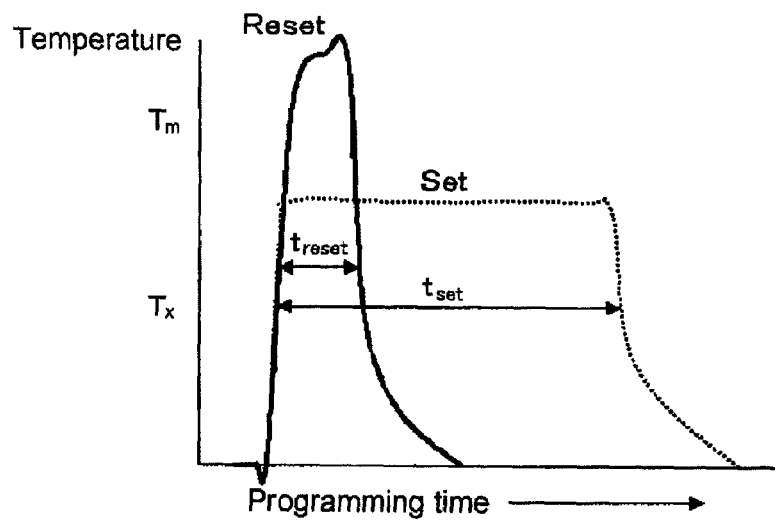
FIG. 2 is a waveform chart showing the current waveform of typical programming of a phase-change memory in the related art.

Explanation next regards exemplary embodiments of the present invention with reference to the accompanying figures. In the following explanation, the memory element of a phase-change memory is assumed to be of a configuration in which, as shown in FIGS. 1A and 1B, a phase-change element and heater are connected in a series, and in which generated heat in the heater causes the phase-change element to undergo a phase change. The exemplary embodiment can of course also be applied to, for example, a configuration in which the heater and phase-change element are not connected in a series, or to a configuration in which the phase-change element changes phase due to the Joule heat of the phase-change element itself.

First Exemplary Embodiment

FIG. 4 shows the voltage waveform of programming pulses and a read pulse based on the method of programming a phase-change memory according to the first exemplary embodiment. As described in the foregoing explanation, there are two types of programming pulses; a resetting pulse used for placing a phase-change element that is in the crystalline state into the amorphous state, and a setting pulse used for placing the phase-change element that is in the amorphous state into the crystalline state. A read pulse is not a pulse for changing the phase state of the phase-change element but rather a pulse applied to the phase-change element for reading the phase state of the phase-change element.

In the first exemplary embodiment, resetting pulse 101 is a pulse having voltage $V_{reset}$ for supplying the current necessary for placing a phase-change element that is in the crystalline state into the amorphous state, and has a pulse width $t_{reset}$ necessary for making the change to the amorphous state. Setting pulse 102 is a pulse having voltage $V_{set}$ that is a voltage equal to or greater than threshold voltage $V_{thB}$ for causing threshold switching in the phase-change element when the phase-change element has attained the amorphous state, the pulse width $t_{set}$ of this setting pulse being equivalent to the resetting pulse width $t_{reset}$, i.e., $t_{set}=t_{reset}$. Read pulse 103 is a pulse having voltage $V_{read}$ that is a voltage equal to or greater than threshold voltage $V_{thA}$ for causing threshold switching in a phase-change element that has been changed to the crystalline state by the execution of set programming. The time width $t_{read}$ of read pulse 103 can be determined as appropriate according to the time necessary for operation of circuits for reading the resistance of the phase-change element. Threshold voltages $V_{thA}$ and $V_{thB}$ will be explained in greater detail hereinbelow.

The following relations hold between each of the above-described voltages:

$$V_{thA}<V_{read}<V_{thB}<V_{set}<V_{reset}.$$

Figure 5:
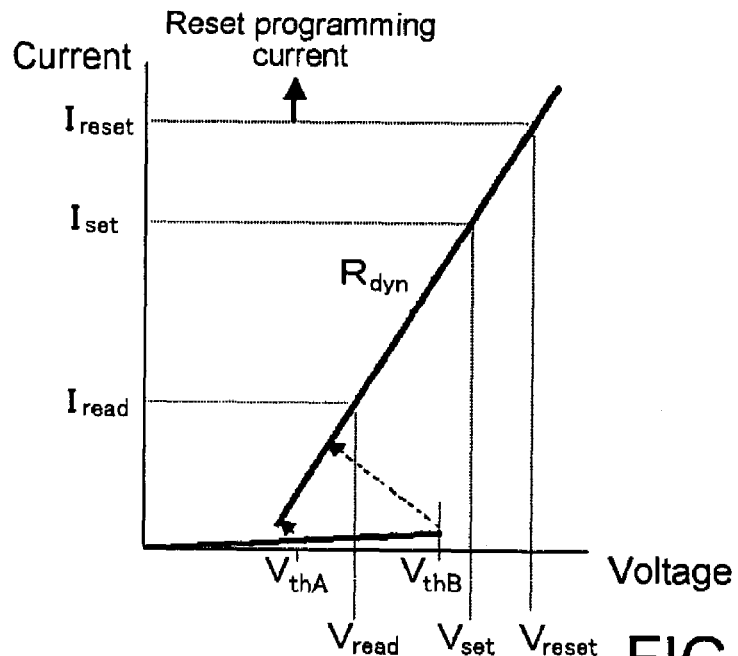
FIG. 5 is a graph showing the current-voltage curve in a phase-change element and illustrates the relation between the voltage and current of each pulse shown in FIG. 4 and the dynamic resistance $R_{dyn}$ of the phase-change element.

FIG. 5 shows the relation between each of the above-described voltages and dynamic resistance $R_{dyn}$. The value of the resistance component inherent to the chalcogenide material that makes up a phase-change element is small, and when a memory element is viewed in its entirety, the dynamic resistance $R_{dyn}$ is substantially dependent on the heater material. A value including resistance R of the heater is defined as dynamic resistance $R_{dyn}$ of the phase-change element.

Explanation next regards the relation between the current and voltage necessary for programming a phase-change element.

In the current-voltage curve shown in FIG. 5, the necessary resetting voltage $V_{reset}$ is found from the intersection between dynamic resistance $R_{dyn}$ and current $I_{reset}$. Here, $R_{dyn}$ is the resistance component necessary for obtaining the amount of generated heat defined approximately by $I^2R$ ((current)$^2$× (resistance)) and $I_{reset}$ is the current necessary for reset programming to cause the phase-change element to transition from the crystalline state to the amorphous state. Current $I_{reset}$ differs according to factors such as the material of the phase-change element.

On the other hand, voltage $V_{set}$ necessary for set programming to cause the phase-change element to transition from the amorphous state to the crystalline state must be set to at least threshold voltage $V_{th}$ that causes threshold switching of the phase-change element. The reason for this requirement is that, when the phase-change element in the high-resistance reset state (i.e., amorphous state) is subjected to programming, current cannot be caused to flow substantially in the phase-change element unless voltage surpassing the threshold voltage is applied, and as a result, the heater cannot generate heat and the state of the phase-change element cannot be changed. In the present exemplary embodiment, voltage $V_{set}$ used in the set programming is assumed to be a lower voltage than $V_{reset}$ and the current used in the set programming is assumed to be $I_{set}$.

Figure 6:
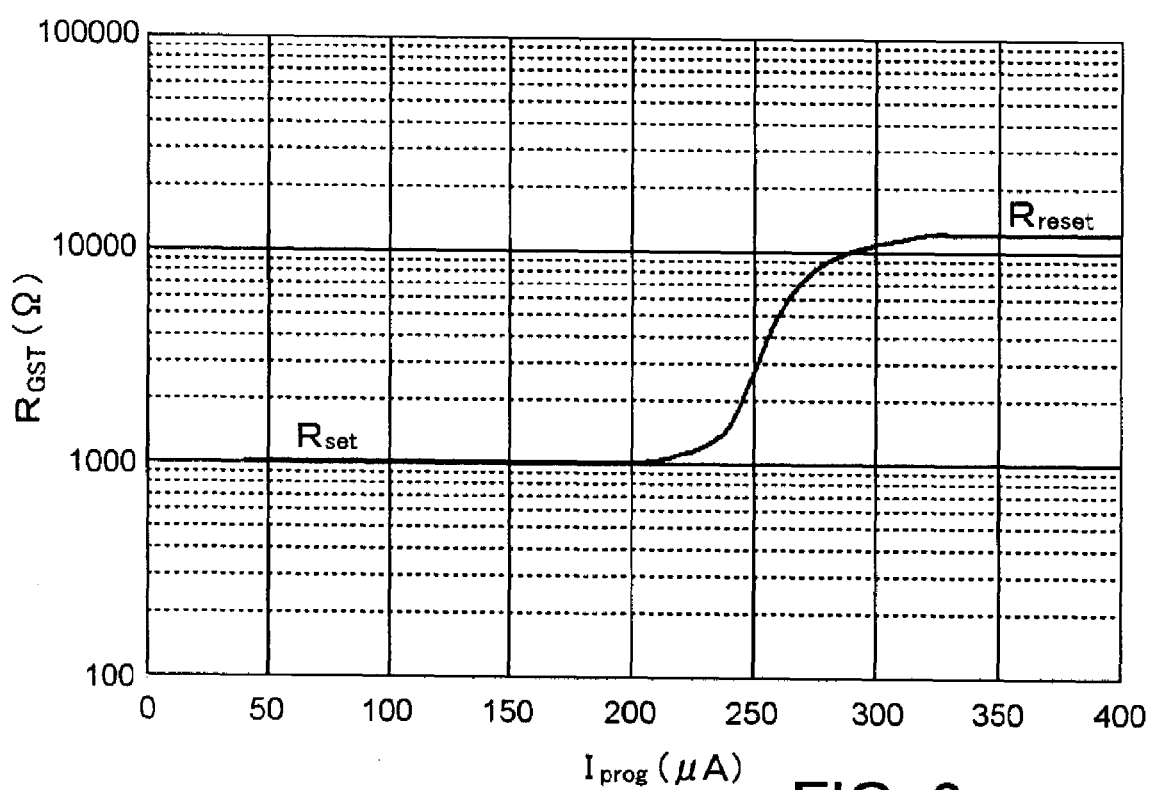
FIG. 6 is a graph showing the relation between the programming current $I_{prog}$ and the resistance $R_{GST}$ of a phase-change element.

The graph of FIG. 6 shows the relation between programming current $I_{prog}$ and resistance $R_{GST}$ of the phase-change element. In FIG. 6, programming current $I_{prog}$ is assumed to be applied at a pulse of the same time width, and FIG. 6 shows the change in resistance when programming pulses are repeatedly applied to the phase-change element, which is in the set state (i.e., crystalline state) that is a low-resistance state, while gradually increasing programming current $I_{prog}$, i.e., while gradually raising the programming voltage. The resistance of the phase-change element in the set state, which is a low-resistance crystalline state, is denoted by $R_{set}$.

Resistance $R_{set}$ of the set state is assumed to be 1 kΩ. As programming current $I_{prog}$ increases, the amount of generated heat of the heater also increases, thereby heating the phase-change element. According to FIG. 6, the resistance of the phase-change element begins to gradually increase from the point at which $I_{prog}$ exceeds 200 μA. When the programming current is further increased, the phase-change element changes from the crystalline state to the reset state, which is the high-resistance amorphous state, and when $I_{prog}$ is on the order of 300 μA, the resistance attains a high level on the order of 10 kΩ. Resistance in the reset state is denoted by $R_{reset}$. In the example of the phase-change element exhibiting the current-resistance curve shown in FIG. 6, $I_{reset}$ is defined as the current value to which +50 μA has been added as a margin for the point at which the resistance of the phase-change element remains substantially unchanged at a high-resistance state despite increase of programming current $I_{prog}$. In this case, $I_{reset}$ is approximately 350 μA.

Thus, the resistance ratio of resistance $R_{set}$ of the set state with resistance $R_{reset}$ of the reset state in a phase-change memory is a figure of one to two or more digits. In contrast, the resistance ratio of the "0" state and the "1" state in an MRAM that uses the magnetoresistance effect is at the most 1.5 to 2, and it can thus be seen that a phase-change memory enables an increase in the dynamic range for reading data. It can therefore be said that phase-change material is superior for realizing a large-capacity memory product, even when variation is taken into consideration.

As described in the foregoing explanation, the first exemplary embodiment enables the use of pulses of the same time width for reset programming and set programming when programming a phase-change memory and thus eliminates the need for superfluous pulse generation circuits and control circuits.

Figure 7:
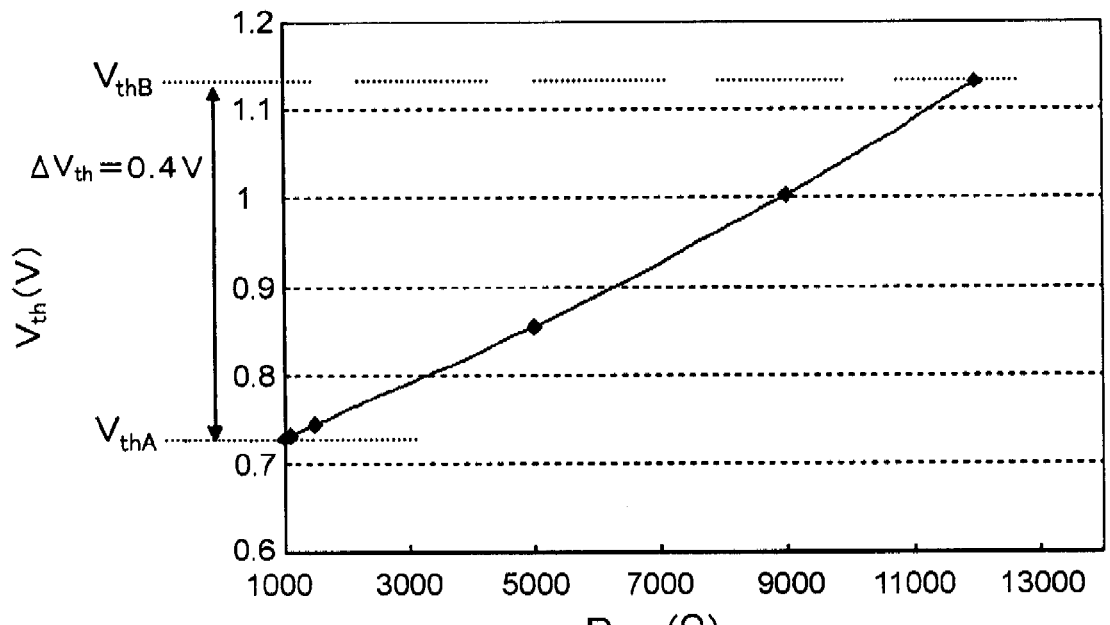
FIG. 7 is a graph showing the relation between a programmed resistance and threshold voltage $V_{th}$ of a phase-change element.

In addition, the change from resistance $R_{set}$ in the set state shown in FIG. 6 to resistance $R_{reset}$ in the reset state suggests that it is also possible to program a phase-change element to a resistance value within the transition state between the set state and reset state by means of programming current $I_{prog}$. FIG. 7 shows the relation between the programmed resistance value including the transitional region and threshold voltage $V_{th}$ of the phase-change element. In FIG. 7, programmed resistance values $R_{GST}$ are shown on the horizontal axis, and threshold voltages of the phase-change element are shown on the vertical axis.

The following explanation regards a programming method realized by changing the threshold voltage of this type of phase-change element and a method of reading information from a phase-change element that has been programmed in this way. The programming method and reading method here described are novel methods that use the threshold switching phenomenon in a phase-change element.

As shown in FIG. 7, threshold voltage $V_{th}$ is determined by the programmed resistance value. In this example, it can be seen that a voltage difference of approximately 0.4V in threshold voltage is generated over the differential resistance between $R_{set}$(=1 kΩ) and $R_{reset}$ (=12 kΩ). In other words, even when pulses of the same time width are used as programming pulses, setting a desired programming current, or in other words, setting a desired programming voltage, enables control of the threshold voltage $V_{th}$ of the phase-change element, and thus enables programming a threshold voltage to the phase-change element. Here, the threshold voltage at the time the phase-change element is in the reset state is defined as $V_{thB}$, and the threshold voltage at the time the phase-change element is in the set state is defined as $V_{thA}$.

Figure 8:
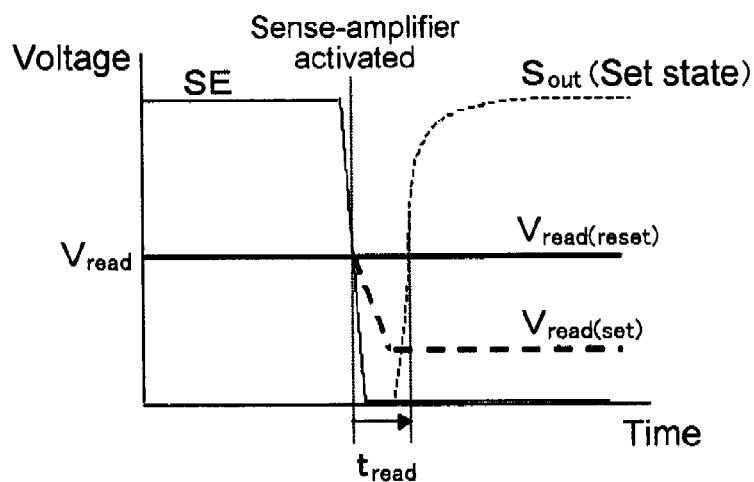
FIG. 8 is a waveform chart showing the waveform of each signal when carrying out reading of information from a phase-change element.

Explanation next regards the operation of reading a phase-change element in which the threshold voltage has been programmed as described above with reference to FIGS. 5 and 8. Here, memory elements for each bit including phase-change elements are connected to sense-amplifiers similar to the case of MRAM or phase-change memory of the related art, and the state of a phase-change element, i.e., whether the phase-change element is in the high-resistance amorphous state or the low-resistance crystalline state, is read. FIG. 8 shows the signal waveforms of control signal SE to a sense-amplifier, read voltage $V_{read}$, and outputs signal $S_{out}$ of the sense-amplifier when reading of information from the phase-change element is being carried out. Output signal $S_{out}$ represents the result of the detection and amplification operation which is performed in the sense-amplifier. It is here assumed that read voltage $V_{read}$ is applied to the phase-change element by way of bit line BL (see FIG. 1B) that has been precharged by a bias power supply generating a prescribed voltage. In other words, when reading from phase-change element (GST) 803 in the circuit arrangement shown in FIG. 1B, bit line BL connected to a sense-amplifier should be precharged to $V_{read}$ and memory cell transistor Tr turned ON, whereby this voltage is applied to phase-change element 803 by way of upper electrode 801 and the drain of transistor Tr.

The sense-amplifier is made active by the change of sense-amplifier control signal SE from H (High) level to L (Low) level. The bias voltage (i.e., read voltage $V_{read}$) required for reading is set between threshold voltage $V_{thB}$ in the reset state and threshold voltage $V_{thA}$ in the set state. As previously described, $V_{thA}<V_{thB}$.

A case is considered for reading a memory cell in the reset state. At this time, the phase-change element is programmed to resistance $R_{reset}$, which is a relatively high resistance, and read voltage $V_{read}$ that is lower than threshold voltage $V_{thB}$ is biased to the phase-change element, whereby threshold switching does not occur. As a result, current does not flow in the phase-change element and the voltage of the bit line is in a state maintained at $V_{read}$, as indicated by $V_{read(reset)}$ in FIG. 8.

In the case of the phase-change element in the set state, on the other hand, bias voltage (i.e., $V_{read}$) that is greater than threshold voltage $V_{thA}$ is applied to the phase-change element when reading. As a result, the phase-change element begins threshold switching and changes from the negative resistance region to the voltage-current (V-I) characteristic region realized by dynamic resistance $R_{dyn}$ (see FIG. 5), whereby current suddenly flows in the phase-change element. As shown as $V_{read(set)}$ in FIG. 8, read voltage $V_{read}$, i.e., the voltage of bit line BL, therefore drops precipitously according to the flow of current in the phase-change element and the voltage level drops. Output signal $S_{out}$ of the sense-amplifier changes from L level to H level with the detection of the change in level of $V_{read(set)}$. In this way, the reset and set states of the phase-change element can be detected and sensed by the reading method of the first exemplary embodiment.

In the reading method of the related art, a sense-amplifier method is employed in which current that flows in accordance with the resistance value of the phase-change memory is detected, and voltage conversion based on this current then carried out to implement voltage amplification. As a result, the related art has the problems that not only is time taken for carrying out current-to-voltage conversion, but because current is read on the phase-change element side, the speed of reading is greatly influenced even by the resistance value of the phase-change element itself. When the resistance value of the phase-change element is within a range of from several kilo-ohms to several tens of kilo-ohms, a current on the order of several tens of microamperes can be caused to flow to the phase-change element, and an access time on the order of approximately 20 ns to 70 ns can be obtained. Here, electrostatic capacitance C existing in the read system is fixed, the resistance of the phase-change element is $R_{GST}$, and the read time interval $t_d$ is generally proportional to $C \times R_{GST}$ and depends on resistance $R_{GST}$ of the phase-change element. When the resistance value of the phase-change element is 100 kΩ, only a current on the order of several microamperes can be caused to flow in the phase-change element, whereby the read margin narrows and access can be achieved only at a low speed on the order of approximately 100 ns to 1 μs.

In contrast, in the above-described reading method that employs the threshold switching proposed in the present exemplary embodiment, the threshold switching phenomenon itself is a phenomenon that occurs on the nanosecond level, and moreover, this occurrence time does not depend on the resistance value of the phase-change element. As a result, the voltage change of $V_{read}$ at the time the bias voltage is applied is at high speed, and high-speed reading is possible.

The foregoing explanation shows that information can be read from the phase-change element as differences of threshold voltages, but when read current $I_{read}$ is applied to the phase-change element in the set state, there is cause for concern that erroneous programming will occur whereby erroneous data may be stored in the phase-change element or data stored in the phase-change element may be destroyed. However, when read current $I_{read}$ is applied to the phase-change element in the set state, erroneous programming does not occur and the above-described concerns are not raised, as will be explained hereinbelow.

When the above-described reading of the phase-change element in the set state is carried out, a voltage exceeding threshold voltage $V_{thA}$ is applied, whereby the phase-change element is placed in a state in which electricity tends to flow due to threshold switching, attaining a state in which heating can occur in the memory element overall. According to FIG. 5, the intersection of the line of $V_{read}$ and the curve of $R_{dyn}$ can be defined as read current $I_{read}$. In the reading method of the first exemplary embodiment, a voltage of a fixed level is supplied from the sense-amplifier as read voltage $V_{read}$, whereby a voltage exceeding the predetermined read voltage $V_{read}$ is not applied to the phase-change element and a current exceeding current $I_{read}$ therefore does not flow in the phase-change element. Here, read voltage $V_{read}$ applied to the phase-change element does not exceed threshold voltage $V_{thB}$ that causes threshold switching in the reset state (amorphous state), and further, is a voltage sufficiently lower than voltage $V_{reset}$ for reset programming or voltage $V_{set}$ for set programming, and as a result, read current $I_{read}$ is a current that is sufficiently lower than set current $I_{set}$ or reset current $I_{reset}$. In other words, the current flowing through the phase-change element is extremely low and there is consequently no change from the set state in which the resistance is $R_{set}$ to the reset state in which the resistance is $R_{reset}$.

At this time, the phase-change element is in a state in which a miniscule current $I_{read}$ is flowing, and as a characteristic of the phase-change element, a transition to the crystalline state can be considered. However, programming the set state, which is a low-resistance state, to an even lower-resistance state does not cause problems, and even if resistance $R_{GST}$ of the phase-change element itself should reach 0Ω, the dynamic resistance $R_{dyn}$ including the heater undergoes almost no change, the resistance value of the system remains substantially uniform, and there is no excessive flow of current. Accordingly, there is no occurrence of erroneous programming.

Second Exemplary Embodiment

Figure 9:
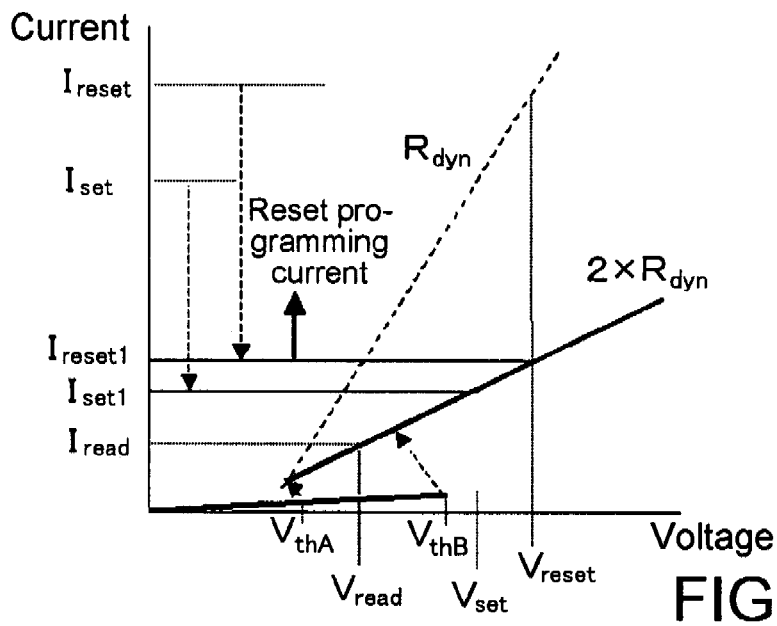
FIG. 9 is a graph showing the current-voltage curve in a phase-change element, and illustrates the relation between the voltage and current of each pulse and the dynamic resistance $R_{dyn}$ of a phase-change element according to the second exemplary embodiment of the present invention.

Explanation next regards the second exemplary embodiment of the present invention. FIG. 9 shows the current-voltage characteristic for a case in which dynamic resistance $R_{dyn}$ is set to approximately twice the value used in the phase-change memory of the first exemplary embodiment. Dynamic resistance $R_{dyn}$ can be made high resistance by selecting the material making up the heater Making the dynamic resistance higher improves the efficiency of heat generation. Put more simply, doubling dynamic resistance $R_{dyn}$ causes doubling of R in the expression ($I^2R$) that represents the amount of generated heat, whereby the efficiency of heat generation also doubles. As a result, when the resistance value of the phase-change element is programmed to the same value, the reset and set currents in the second exemplary embodiment can be decreased to $I_{reset1}$ and $I_{set1}$, respectively, which are lower values than in the first exemplary embodiment. This reduction of current is obviously preferable from the standpoint of power consumption.

Figure 10:
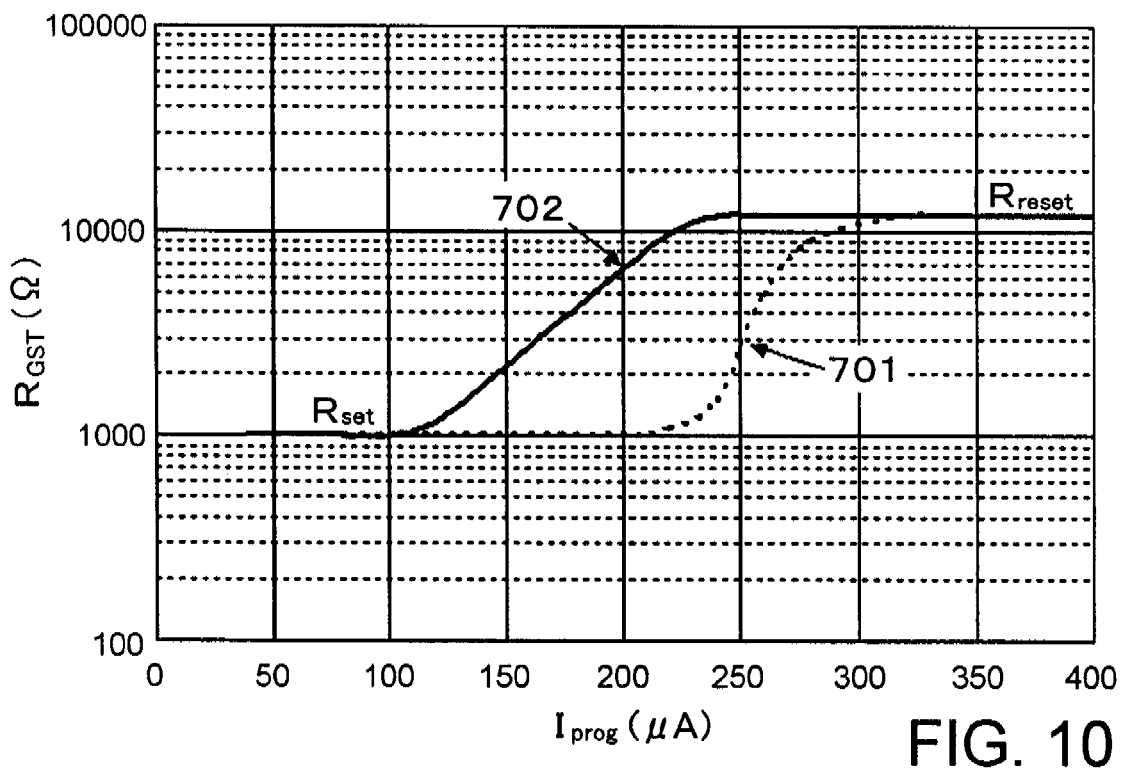
FIG. 10 is a graph showing the relation between programming current $I_{prog}$ and resistance $R_{GST}$ of a phase-change element in the second exemplary embodiment.

FIG. 10 is a graph in which the change in resistance of the phase-change element is plotted when $R_{dyn}$ is doubled and added to the characteristic graph of change of $R_{GST}$ with respect to $I_{prog}$ of FIG. 6 to which reference was made in the explanation of the first exemplary embodiment. In FIG. 10, the resistance change curve indicated by reference numeral 701 shows the result of the first exemplary embodiment. In contrast, reference numeral 702 shows the resistance change curve when dynamic resistance $R_{dyn}$ is twice that of the first exemplary embodiment. Resistance change curve 702 of the second exemplary embodiment differs significantly from resistance change curve 701 of the first exemplary embodiment in that the slope of resistance change with respect to programming current $I_{prog}$ is smaller and the change from the set state to the reset state occurs at a lower current. In the second exemplary embodiment, resistance $R_{GST}$ of the phase-change element begins to change when the current is on the order of 100 µA and the value of resistance $R_{GST}$ attains saturation when the current reaches approximately 250 µA.

The moderate slope of the resistance-change curve results from the moderate proportion of resistance change with respect to programming current $I_{prog}$, and the margin of resistance change broadens for variations in programming current $I_{prog}$. When manufacturing large-capacity memory devices, the current-voltage variation is typically large, and increasing dynamic resistance $R_{dyn}$ broadens the manufacturing margins. However, increasing dynamic resistance $R_{dyn}$ also causes an increase in the resistance value of selection paths for selecting memory cells, and when a current sense-amplifier of the related art is used, there is a possibility that the sensing speed will be strongly influenced and the operating speed will drop. In the reading method based on the exemplary embodiments, however, reading of information from a phase-change element is realized by detecting change in the threshold voltage of threshold switching, and as a result, the reading speed remains virtually unaffected despite increase in the resistance value of the selection paths.

In the phase-change memory programming method of the related art, pulses of different time widths were used when placing the phase-change element in the set state and in the reset state, but in the programming method of each of the exemplary embodiments, pulses of the same time width can be used for setting and resetting although the voltages differ, as described in the foregoing explanation. This ability to program at the same time width is achieved because the programming methods of the exemplary embodiments advance from the programming method of the related art that is based on changes in the resistance value in a phase-change element and implement programming from the standpoint of changing threshold voltage $V_{th}$ at which threshold switching occurs in the phase-change element.

More specifically, in the programming method of each of the exemplary embodiments, the dynamic resistance is increased when a phase-change element composed of a chalcogenide is used, or the resistance of the heater element, which is used for heating the phase-change element and which dominantly governs the dynamic resistance, is raised. When carrying out programming that forces attainment of the resistance of the set state or reset state, the use of programming pulses that exceed $V_{th}$ of the phase-change element, and further, that are of the same pulse width but that are of different programming voltages for transition to the set state and transition to the reset state enables programming to either of states for which threshold voltages differ, i.e., the set state and reset state.

According to each of the above-described exemplary embodiments, a method is provided for reading information from a phase-change element that has been programmed to have different threshold voltages by means of this type of method. More specifically, a read voltage is set at a level between the threshold voltage in the set state and the threshold voltage in the reset state, and information stored in a phase-change element can be read at high speed by detecting the voltage change resulting from the voltage drop caused by the initiation of threshold switching by a memory cell in the set state.

In the programming method according to another exemplary embodiment, the phase-change element and a heater thermally coupled with the phase-change element are preferably electrically connected in a series, and the first pulse and the second pulse are preferably applied to the serially connected unit of the phase-change element and the heater.

In the reading method according to a further exemplary embodiment, for example, the information stored in the phase-change memory is preferably read by applying the read voltage to the phase-change element by way of a bit line that is connected to a sense-amplifier and that is precharged to the read voltage, amplifying, by means of the sense-amplifier, the voltage change of the bit line when the read voltage is applied, and determining the information based on an output of the sense-amplifier.

While an exemplary embodiment of the present invention has been described using specific terms, such description is for illustrative purposes only, and it is to be understood that changes and variations may be made without departing from the spirit or scope of the following claims.

What is claimed is:

1. A programming method of a phase-change memory having a phase-change element that transitions between a reset state corresponding to an amorphous state and a set state corresponding to a crystalline state, said method comprising:
   when said phase-change element is to be caused to transition to said reset state, applying to said phase-change element a first pulse having a first voltage that is a voltage higher than a threshold voltage for causing threshold switching in said phase-change element in said reset state, and moreover, that is a voltage that can cause a current to flow that corresponds to an amount of generated heat necessary for placing said phase-change element in said reset state; and
   when said phase-change element is to be caused to transition to said set state, applying to said phase-change element a second pulse having a second voltage that is higher than said threshold voltage but lower than said first voltage, and moreover, that is a voltage that only causes current to flow that cannot attain said necessary amount of generated heat,
   wherein the time width of said first pulse is equal to the time width of said second pulse.

2. The method according to claim 1, wherein said phase-change element and a heater that is thermally coupled to said phase-change element are electrically connected in a series, and said first pulse and said second pulse are applied to the serially connected unit of said phase-change element and said heater.

3. A programming method of a phase-change memory having a phase-change element that transitions between a reset state corresponding to an amorphous state and a set state corresponding to a crystalline state, said method comprising:
   when said phase-change element is to be caused to transition to said reset state, applying to said phase-change element a first pulse of a first current such that said phase-change element is placed in a state in which threshold switching is brought about at a first threshold voltage after application of said first pulse; and
   when said phase-change element is to be caused to transition to said set state, applying to said phase-change element a second pulse of a second current such that said phase-change element is placed in a state in which threshold switching is brought about at a second threshold voltage that is lower than said first threshold voltage after the application of said second pulse,
   wherein said second current is smaller than said first current, and the time width of said first pulse is equal to the time width of said second pulse.

4. The method according to claim 3, wherein said phase-change element and a heater that is thermally coupled to said phase-change element are electrically connected in a series, and said first pulse and said second pulse are applied to the serially connected unit of said phase-change element and said heater.

* * * * *